United States Patent [19]

Shaffer et al.

[11] 4,282,558
[45] Aug. 4, 1981

[54] MULTILAMP PHOTOFLASH UNIT WITH CIRCUIT CROSSOVER

[75] Inventors: John W. Shaffer; William T. Colville; David W. Mecone, all of Williamsport, Pa.

[73] Assignee: GTE Products Corporation, Stamford, Conn.

[21] Appl. No.: 74,194

[22] Filed: Sep. 10, 1979

[51] Int. Cl.³ .............................................. G03B 15/02
[52] U.S. Cl. ..................................... 362/15; 362/240; 362/241
[58] Field of Search .......................... 362/15, 240, 241

[56] References Cited

U.S. PATENT DOCUMENTS 3,952,320 4/1976 Blount .................................. 362/11 X
4,059,387 11/1977 Witterick et al. .................. 362/11 X Primary Examiner—Stephen J. Lechert, Jr.
Attorney, Agent, or Firm—Edward J. Coleman

[57] ABSTRACT

A photoflash unit comprising a linear array of flashlamps mounted on a printed circuit strip disposed within the longitudinal channel of an elongated housing member having an enclosing cover panel of light-transmitting material. The unit has connector terminals at opposite ends, and the linear array of flashlamps is divided into two groups disposed in opposite halves of the unit, each group of lamps being operated by the connector terminals at the remote end so as to reduce the red-eye photographic effect. The lamp-firing circuitry includes a pair of common circuit conductor runs respectively located on opposite halves of the printed circuit strip and on opposite sides of a common surface. An interconnecting jumper, or crossover, between the common circuit runs is provided through continuous conductive reflector surfaces on the housing channel which make contact with conductive deposits extending from the respective common circuit runs to the edge of the printed circuit strip.

10 Claims, 5 Drawing Figures

MULTILAMP PHOTOFLASH UNIT WITH CIRCUIT CROSSOVER

BACKGROUND OF THE INVENTION

This invention relates to multilamp photoflash units and, more particularly, to an improved photoflash unit having a circuit crossover provision for spaced apart conductor runs on a printed circuit board supporting an array for flashlamps within the unit housing.

Numerous multilamp arrangements with various types of sequencing circuits have been described in the prior art, particularly in the past few years. A currently marketed photoflash unit (described in U.S. Pat. Nos. 3,894,226 and 4,017,728 and referred to as flip flash) employs high voltage type lamps adapted to be ignited sequentially by successively applied high voltage firing pulses from a source such as a camera-shutter-actuated piezoelectric element. The flip flash unit comprises an elongated planar array of eight high voltage type flashlamps mounted on a printed circuit board with an array of respectively associated reflectors disposed therebetween. The lamps are arranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower groups of lamps. The application of successive high voltage pulses (e.g. 2,000 to 4,000 volts from, say, a piezoelectric source controlled by the shutter of a camera in which the array is inserted) to the terminal contact at the lower end of the unit causes the four lamps at the upper half of the array to be sequentially ignited. The array may then be turned end for end and again inserted into the camera in order to flash the remaining four lamps. In this manner one group of lamps (or half of the array) functions as a flash extender for the other group of lamps so that only the group of lamps relatively farther from the camera lens axis may be flashed. The purpose of such an arrangement is to position the "active" group of flashlamps farther above the camera lens in order to reduce the possibility of a "red-eye" effect that causes the pupils of a person's eyes to appear red or pink in flash pictures taken when the flashlamp is close to a camera lens.

The flip flash circuit board comprises an insulating sheet of plastic having a pattern of conductive circuit runs, including the terminal contacts, on one surface. The flashlamp lead-in wires are electrically connected to the circuit runs by means of eyelets secured to the circuit board and crimped to the lead-in wires. The circuitry on the board includes six printed, normally open, connect switches that chemically change from high to low resistance so as to become electrically conducting after exposure to the radiant energy from an ignited flashlamp operatively associated therewith. The purpose of these switches is to provide lamp sequencing and one-at-a-time flashing. The four lamps of each group are arranged in a parallel circuit, with three of the four lamps being connected in series with respective thermal connect switches. The circuitry on the board further includes a common circuit conductor run which is connected to one lead-in wire of each of the flashlamps in both groups and extends continuously from one end of the circuit board to the other between the common terminal contact at each end of the unit. Initially, only the first of the group of four lamps is connected directly to the high voltage pulse source. When this first lamp flashes, it causes its associated thermal connect switch (which is series connected with the next or second lamp) to become permanently conductive. Because of this action, the second lamp of the group of four is connected to the pulse source. This sequence of events is repeated until all four lamps have been flashed.

The overall construction of the flip flash unit comprises front and back plastic housing members with interlocking means for providing a unitary structure. The front housing member is a rectangular concavity, and the back housing is substantially flat. Sandwiched between the front and back housing members, in the order named, are the flashlamps, a unitary member, preferably of aluminum-coated plastic, shaped to provide the eight individual reflectors of the array, an insulating sheet, a printed circuit board, and an indicia sheet, which is provided with information trademarks and flash indicators located behind the representative lamps and which change color due to heat and/or light radiation from a flashing lamp, thus indicating at a glance which of the lamps have been flashed and not flashed. Each of the individual reflectors has a concave (generally parabolic) surface with the lamps being disposed within this concavity; the rear surface of the reflector has holes or slots to permit light and heat radiation to pass through for actuating circuit board switches and flash indicators. In order to provide electrostatic shielding for the lamps and circuitry, the reflector member is rendered electrically conductive by a reflective metalized coating thereon, and this coating is electrically connected to the common circuit conductor run on the printed circuit board. Further, a metal foil is laminated on the indicia sheet and also connected to this common conductor run of the circuit board.

U.S. Pat. No. 4,164,007 describes an improved multilamp photoflash unit which more efficiently utilizes a given housing volume and thereby reduces the cost of the unit per flashlamp contained therein. More specifically, a compact lamp arrangement is provided whereby additional lamps are contained in a given volume while maintaining light output performance requirements. In a particular embodiment described, ten lamps are provided in a housing having the same dimensions as the above-discussed eight-lamp flip flash unit. This greater compactness is provided by arranging the planar array of lamps in two parallel columns with the tubular envelopes horizontally disposed and with the lamps of one column staggered with respect to the others so that the bases are interdigitated. A pair of reflector panels are aligned with the two columns of lamps and are arranged to overlie the lamp lead-in wires and bases.

A copending application Ser. No. 072,251, assigned to the present assignee, describes a more compact cost-efficient photoflash unit construction comprising a linear array of electrically ignitable flashlamps mounted on a printed circuit board in the form of an elongated strip. The printed circuit strip is located within the longitudinal channel of an elongated housing member having reflective surfaces adjacent to the lamps. A light-transmitting cover panel is attached to the front of the housing member to enclose the flashlamps. The lamps have substantially tubular envelopes and are positioned extremely close to one another with their longitudinal axes substantially parallel to the surface of the printed circuit strip and in substantially coaxial alignment. Typically, the diameter of the lamps, the width of the printed circuit strip, and the width of the channel in the housing member are nearly equal. In order to provide protection against the red-eye effect, a double-ended linear array is described which operates in similar fashion to the aforementioned flip flash. In one specific embodiment, three lamps mounted in the upper half of the printed circuit strip are controlled by a pair of contact terminals at the lower end of the unit, while three lamps in the lower half of the unit are controlled by contact terminals at the top end of the unit. One of the contact terminals for controlling a group of lamps is connected in common to a lead-in wire of each of the lamps of the group, while the other contact is a "hot", or signal, terminal coupled through switching circuitry to the other lead-in wire of each of the lamps. Accordingly, in order to provide an interconnection between the signal terminals at each end of the unit and the respective switching circuitry controlled thereby on opposite halves of the printed circuit strip, respective signal conductor runs must be extended through the respectively inactive halves of the circuit strip. The interconnecting conductor runs from the common terminal contacts are disposed along the outer sides of the circuit-containing circuitry of the printed circuit board. More specifically, the common circuit conductor run on the bottom half of the circuit strip is located on opposite sides of the circuit strip. As a result, a crossover, or side-to-side connection of the common circuit run is required in order to connect the common terminal at one end of the printed circuit strip with the common circuit conductor run connected to lamp leads in the opposite half of the circuit strip. Such a problem is created by the severe crowding of the conductive paths of this extremely compact unit. The use of both sides of the circuit strip introduces undesirable cost, e.g. two circuit screening operations are needed as well as eyelets or other feed-through means. A minimum inter-run spacing of about 1.5 millimeters is necessary in order to prevent failure, i.e. promoting electrical sparkover from one run to another at the high voltages used (e.g. 2,000 volts or more).

SUMMARY OF THE INVENTION

Accordingly, it is an object of the present invention to provide an improved multilamp photoflash unit which is significantly more compact and economically includes a crossover interconnection for spaced printed circuit conductor runs.

A principal object is to economically provide means for electrically interconnecting a pair of spaced apart conductor runs on a printed circuit board in a multilamp photoflash unit having a simplified, more cost-efficient construction which is significantly more compact.

These and other objects, advantages and features are attained in a multilamp photoflash unit comprising a printed circuit board in the form of an elongated strip and having lamp firing circuitry on a surface thereof to which the lead-in wires of an array of flashlamps are connected. The flashlamps are divided into first and second groups of two or more lamps each disposed on respectively opposite halves of the printed circuit strip over the surface containing circuitry. The circuit board and lamps are disposed within the longitudinal channel of an elongated housing member having reflective surfaces adjacent to the flashlamps. The circuitry on the printed circuit strip includes first and second common circuit conductor runs which are spaced apart from each other on the lamp mounting surface. The first common circuit run is connected electrically to one lead-in wire of each of the first groups of lamps and the second common circuit run is connected electrically to one lead-in wire of each of the second groups of lamps. The means for electrically interconnecting the first and second common circuit conductor runs comprises covering the walls of the housing channel with a continuous coating of electrically conductive reflective material to provide the reflective surfaces for the lamps, and then providing first and second means for electrically connecting the reflective surfaces of the channel walls to the first and second common circuit conductor runs on the printed circuit strip. In this manner, the conductive reflective material on the channel walls of the housing functions as an interconnecting jumper, or crossover connection, between the spaced apart, common circuit conductor runs.

In a preferred embodiment, the printed circuit strip includes first and second connector terminal means at respectively opposite ends, with the first connector-terminal being located on the half of the circuit strip containing the first group of lamps and separated thereby from the second group of lamps, and the second connector-terminal being located on the half of the circuit strip containing the second group of lamps and separated thereby from the first group of lamps. The first common circuit run extends to the first connector-terminal means and the second common circuit run extends to the second connector-terminal means. A portion of the circuitry couples the first connector-terminal means to each lamp of the second group of lamps, and another portion of the circuitry couples the second connector-terminal means to each lamp of the first group of lamps. The first and second group of lamps are disposed in a linear array, and the channel in the housing member has a cross-section which is substantially semi-rectangular. The continuous coating of conductive reflective material covers the rear wall and opposite sidewalls of the semi-rectangular channel, and the first and second common circuit runs are respectively disposed parallel and closer to opposite edges of the printed circuit strip facing opposite sidewalls of the channel. The means for connecting the common circuit runs to the reflective surfaces comprise first and second deposits of conductive material on the printed circuit strip which extend from respective ones of the common circuit runs to the nearest edge of the strip facing a sidewall of the channel. The width of the printed circuit strip is about equal to the width of the channel, hence, the first and second deposits of conductive material are respectively in electrical contact with the conductively coated opposite sidewalls of the channel. These conductive deposits may be located substantially adjacent to the connector-terminal means for the common circuit conductors, and/or the deposits may be located adjacent to termination of the common circuit runs near the midportion of the circuit strip.

Preferably the housing member is formed of an insulating material and further includes a plurality of segments of reflector cavities formed on opposite sides of the channel. The continuous coating of electrically conductive reflective material then covers the surfaces of both the channel and the reflector cavities. Further, since these partially enclosing continuously coated surfaces are in contact with the common circuit runs, an effective "ground" shield is provided for the unit. Accordingly, the conductive reflective surfaces provide a tripartite function, namely, (a) as reflectors for the flashlamps, (b) as an interconnecting jumper between the first and second spaced apart common circuit runs, and (c) as a shield to reduce the likelihood of the flashlamps being fired by electrostatic charges applied to the unit. The required crossover connection in a compact array is effectively and inexpensively achieved by use of the metalized reflector of the multilamp photoflash unit as an active, current-carrying segment of the circuitry for carrying lampflashing current pulses from the camera socket interface to the lamps in the far end of the array.

BRIEF DESCRIPTION OF THE DRAWINGS

This invention will be more fully described hereinafter in conjunction with the accompanying drawings, in which.

DESCRIPTION OF PREFERRED EMBODIMENT

Figures 1, 2:
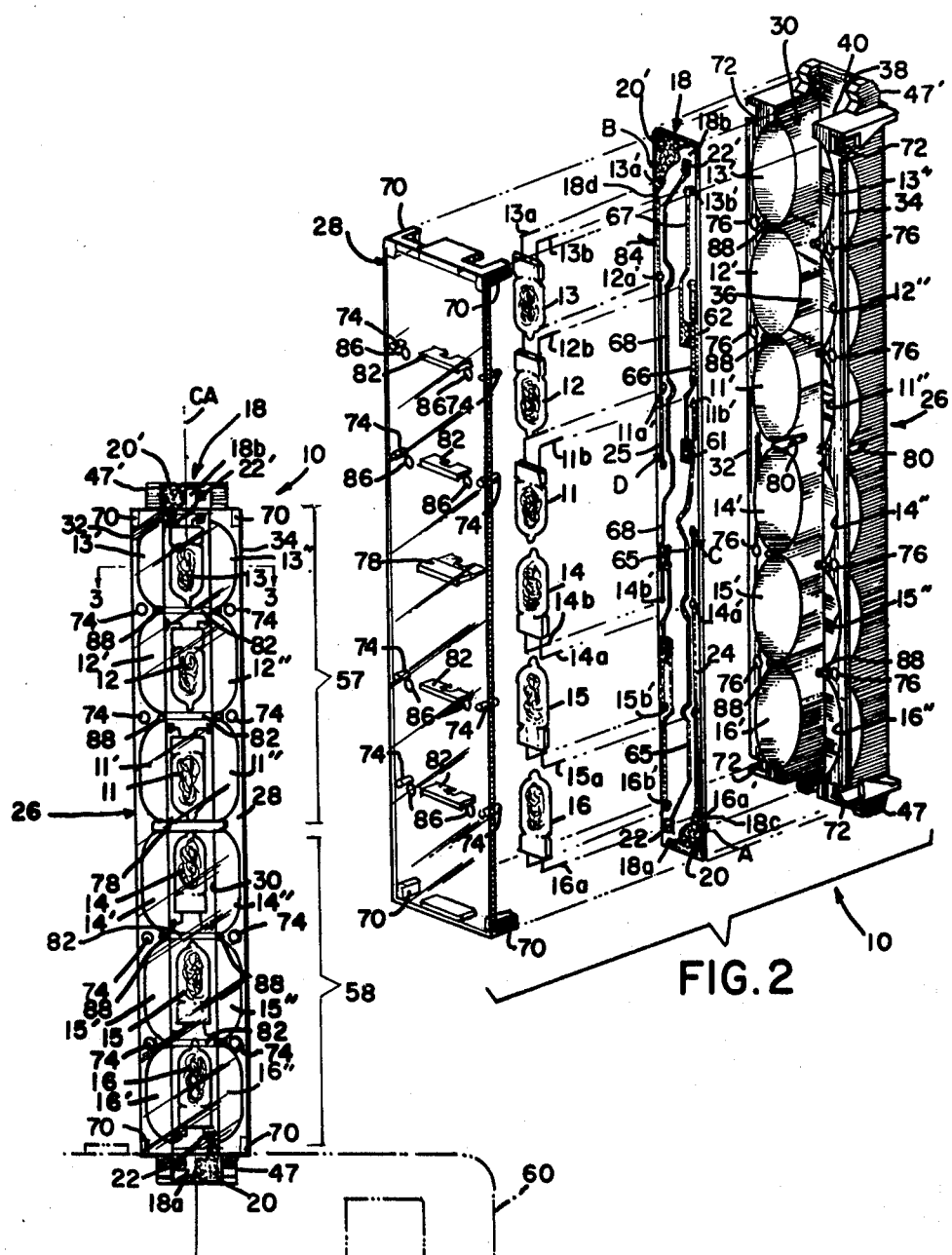
FIG. 1 is a front elevation of a multilamp photoflash unit in accordance with the invention, with the camera on which it is mounted shown in phantom.
FIG. 2 is an exploded perspective view of the photoflash unit of FIG. 1.

FIGS. 1 and 2 illustrate a multilamp photoflash unit 10 similar to that described in the aforementioned copending application Ser. No. 072,251. It comprises a linear array of six flashlamps 11-13 and 14-16 mounted on a printed circuit board 18 in the form of an elongated strip. Each of the lamps has a pair of lead-in wires 11a, 11b, etc. connected to the printed circuitry on strip 18. For example, the lead-in wires 11a, 11b, etc., may be soldered to respective connector pads 11a', 11b', etc., forming portions of the conductive circuit runs on strip 18. Each of the lamps 11, etc. has a tubular light-transmitting glass envelope having a press-seal base at one end through which the lead-in wires emerge, and an exhaust tip at the other end. The envelope is filled with a quantity of filamentary combustible material, such as shredded zirconium, and a combustion-supporting gas, such as oxygen. The ignition means within the lamp envelope may comprise, in the case of a low voltage source, a filament connected across the inner ends of the lead-in wires with beads of primer material disposed about the junctions of the lead-in wires and filament. In the case of a high voltage power source, for which the illustrated embodiment is particularly intended, the ignition structure may comprise a primer bridge or a spark gap type construction. For example, a particularly suitable high-voltage type flashlamp suitable for use in the linear array according to the present invention is described in U.S. Pat. No. 4,059,389, wherein the ignition structure comprises a pair of spaced apart lead-in wires with spherically shaped terminations, a glass frit coating over the lead-in wires and a coating of primer material over the frit-coated terminations. The primer may bridge the wire terminations or comprise separate spaced apart coatings on the respective terminations, with the filamentary combustible being in contact with both terminations to provide a conducting path therebetween.

When the flashlamps are mounted and positioned on circuit strip 18, the lead-in wires 11a, 11b, etc., are bent at a right angle, as illustrated, so that all of the tubular envelopes of the lamps are positioned with the longitudinal axis thereof substantially parallel to the surface of printed circuit strip 18 and arranged in substantially coaxial alignment along a common longitudinal axis CA. Further, as described in copending application Ser. No. 072,526, assigned to the present assignee, the three lamps 11-13 at the top half of the array are inverted with respect to the three lamps 14-16 at the bottom half of the array.

Referring to FIG. 2, the circuit strip 18 has a "printed circuit" thereon for causing sequential flashing of the lamps by applied firing voltage pulses. In this particular embodiment, essentially the entire printed circuit is provided on one surface of the strip 18, namely, the obverse side of the strip over which the flashlamps are positioned. The substrate of strip 18 comprises an insulating material, such as polystyrene or phenolic, etc., and the pattern of conductor runs may be provided on the surface thereof by means such as silk screening, chemical etching of a copper cladding, etc. Each end of the circuit strip 18 functions as a connector tab, denoted as 18a and 18b respectively. The tab 18a is provided with a pair of electrical terminals 20 and 22, and similarly, the tab 18b is provided with a pair of terminals 20' and 22' for contacting terminals of a camera socket for applying firing voltage pulses to the array. As will be described in more detail hereinafter, the terminal 20 forms part of and is connected to a common circuit conductor run 24 which is disposed parallel to edge 18c of the circuit strip and connected electrically to one lead-in wire of each of the flashlamps 14-16, and terminal 20' forms part and is connected to a common circuit conductor run 25 which is disposed parallel to edge 18d of the circuit strip and connected electrically to one lead-in wire of each of the flashlamps 11-13.

The terminations of conductor runs 24 and 25 are spaced apart at the midportion of the circuit strip 18 because of other circuit runs crowded therebetween; in accordance with the present invention, however, the runs 24 and 25 are interconnected by a crossover, or jumper, interconnection means to be described in detail hereinafter. As a result, terminals 20 and 20' function as part of a "ground" circuit and are shown as having an enlarged configuration for reducing the likelihood of lamps being accidentally flashed by electrostatic voltage when the array is handled.

Figure 3:
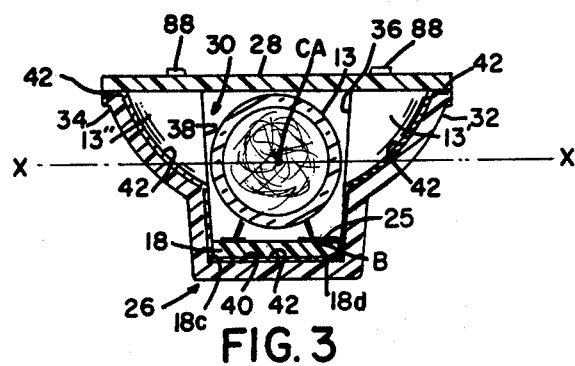
FIG. 3 is an enlarged cross-sectional view taken along 3—3 of FIG. 1.
Figure 4:
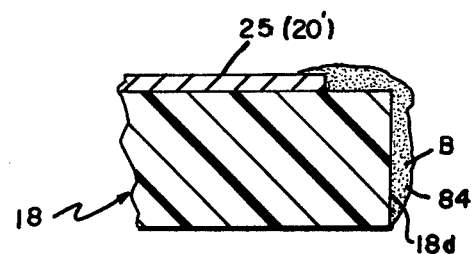
FIG. 4 is an enlarged fragmentary cross-section of a portion of the printed circuit strip of the unit of FIGS. 1-3 particularly showing a conductive deposit extending onto an edge of the printed circuit strip.
Figure 5:
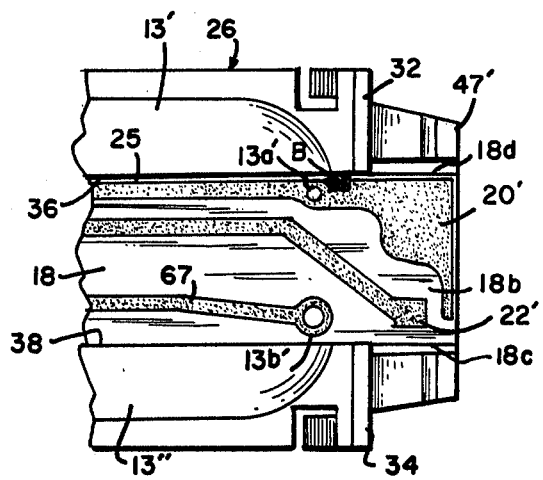
FIG. 5 is a front fragmentary view of an end portion of the housing member of the unit of FIGS. 1-3 showing the printed circuit strip located therein.

The circuit strip-lamp assembly, which forms the functional core of the unit 10, is enclosed in a comparatively simple and compact housing construction of a cost-efficient and versatile design. More specifically, the unit enclosure comprises just two components, namely, a rear housing member 26 and a light-transmitting cover panel 28. Referring also to FIG. 3, housing member 26 has an elongated configuration and includes a longitudinal channel 30 which has a cross-section which is substantially semi-rectangular. The circuit strip-lamp assembly is located within channel 30, and cover panel 28 is attached to the front of the housing 26 so as to enclose the lamps. As illustrated in FIG. 1, the ends of tabs, 18a and 18b of the circuit strip extend beyond the opposite ends of the elongated cover panel 28 to expose the terminals 20, 22 and 20', 22', thereon for connection to a camera.

The rear housing member 26 further includes outer flanges 32 and 34 which adjoin the opposite sidewalls 36 and 38, respectively, of the semi-rectangular channel. Formed in these outer flanges are a plurality of symmetrical segments of parabolic reflector cavities, with each pair of reflector cavity segments 11', 11", etc. on opposite sides of the channel 30 being associated with a respective one of the flashlamps 11, etc. Housing member 26 is molded of an insulating plastic material, such as polystyrene, but reflective surfaces are provided adjacent to all the flashlamps by covering all of the surfaces of channel 30 (i.e., sidewalls 36 and 38 and rear wall 40) and the surfaces of the outer flanges 32 and 34 which face the cover panel, including the parabolic reflector cavity segments 11', 11", etc., with a continuous coating of conductive reflective material 42. For example, the channel and front surfaces of the flanges may be metalized such as by an aluminum vacuum deposition process. In this manner, member 26 integrally functions as a compact, cost-efficient, multi-cavity reflector member in addition to functioning as a rear housing enclosure. It will be noted that the lamp-carrying terminal strip is located substantially internal to this reflector member. Further, referring particularly to FIGS. 1 and 3, it will also be noted that the common longitudinal axis CA of the linear array of flashlamps 11, etc., is substantially parallel to the longitudinal axis of printed circuit strip 18 and channel 30 and lies in a plane x—x which symmetrically intersects the parabolic reflector cavity segments 11', 11", etc., on opposite side wall reflector surfaces are located behind the longitudinal center line of the lamps so that as each lamp is flashed, light is projected forwardly of the array.

The housing member further includes integral extensions 47 and 47' at the opposite ends thereof which partly surround and protect the extending connector tabs 18a and 18b of the printed circuit strip 18, exposing the terminals thereon, and also function to facilitate mechanical attachment to the camera socket. The printed circuit strip 18 may be secured in channel 30 by means such as providing an interference fit with walls 36 and 38 or by applying a cement between the back of the strip 18 and the rear channel wall 40 (FIG. 3).

The light transmitting cover panel 28 basically comprises a planar strip of clear plastic material, such as polystyrene, and may be attached to the plastic rear housing member 26 by conventional methods, such as the use of cement or ultrasonic welding about the periphery. Improved structural rigidity and cost-efficiency, however, are provided by a preferred method of attachment described in copending application Ser. No. 072,529, assigned to the present assignee. Referring to FIGS. 1 and 2, the cover panel molding includes four rectangular corner posts 70 which fit into corresponding slots 72 in the housing member flanges and straddle respective ends thereof. These corner posts grip the sides of housing member 26 on the outside and are ultrasonically welded thereto. This secures the ends of the panel and prevents spreading of the respective ends of the housing. Along each side of the midportion of the cover are provided four cylindrical posts 74 (a total of eight) which fit into corresponding holes 76 in the rear housing. Ultrasonically heated and pressure-formed rivet heads (not shown) are formed on the ends of these posts to secure the longitudinal edges of the cover to the housing. Further, cover panel 28 includes a transverse web 78 which projects from the center thereof and fits within slots 80 in the sidewalls 36 and 38 of the housing channel 30. Web 78 thereby bridges the housing channel to provide oppositely directed forces with respect to the four corner posts 70 so as to prevent collapse of the central portion of the cover panel and assure a snug fit. Ultrasonic welding is also employed on each side of the web 78 which engages a slot 80.

As described in copending application Ser. No. 072,534, assigned to the present assignee, the integral transverse web 78 of cover 28 also provides a light-attenuating partition between the tips of lamps 11 and 14 to prevent sympathetic flashing. Additional transverse webs 82 of reduced size are also provided as integral parts of cover 28 to prevent sympathetic flashing between the remainder of the lamps.

When fully assembled, the completed photoflash unit according to the invention is provided with a plug-in connector tab 18a at the lower end thereof which is adapted to fit into a camera or flash adapter. A second plug-in connector tab 18b is provided at the top end of the unit whereby the array is adapted to be attached to the camera socket in either of two orientations, i.e. with either the tab 18a or 18b plugged into the socket. The lamps are arranged in two groups of three disposed on the upper and lower halves, respectively, of the elongated linear array. Upper group 57 comprises lamps 11–13, and lower group 58 includes lamps 14–16; the reflector cavity segments 11', 11", etc., along with the reflective channel sidewalls, are associated with the respective lamps so that at each lamp is flashed, light is projected forwardly of the array. The lamps are arranged and connected so that when the array is connected to a camera by the connector tab 18a (such as illustrated in FIG. 1 for the case of camera 60 shown in phantom) only the upper group 57 of the lamps will be flashed, and when the array is turned end for end and connected to the camera by the other connector tab 18b, only the then upper group 58 of lamps will be flashed. By this arrangement, only lamps relatively far from the camera lens axis are flashable, thus reducing the undesirable red-eye effect.

Referring to FIG. 2, the circuit board 18 has a "printed circuit" thereon for causing sequential flashing of the lamps by firing voltage pulses applied to the terminals 20, 22, 20', 22'. The top and bottom of the printed circuitry preferably are reverse mirror images of each other. The circuit located on the upper half of the circuit strip 18 and activated by the pair of terminals 20 and 22 include three lamps 11–13 arranged in parallel across the input terminals. The circuit also includes two normally open (N/O) radiant-energy-activated connect switches 61 and 62 for providing sequential flashing of the lamps 11–13 in response to firing pulses successively applied to the input terminals 20 and 22. Each N/O connect switch is responsive to the flashing of an associated lamp to form a closed circuit condition.

Terminal 22 is part of a "hot" or signal circuit conductor run 65 that extends upwardly through the lower half of circuit strip 18 and terminates at a lead-in wire of lamp 11 and one terminal of the N/O switch 61 in the upper half of the circuit strip. The other side of switch 61 is connected to a lead-in wire of lamp 12 and to one terminal of N/O switch 62 via circuit run 66. Circuit run 67 then connects the other terminal or switch 62 to a lead-in wire of lamp 13.

On the other half of the circuit strip, terminal 22' is part of a signal circuit conductor run 68 that extends downwardly through the upper half of circuit strip 18 and terminates at a lead-in wire of lamp 14. The remainder of the circuitry in the lower half of the circuit strip is similar to that described above for the upper half of the circuit strip. As described hereinbefore, the terminals 20 and 20' comprise integral portions of respective common circuit conductor runs 24 and 25. These common circuit runs respectively terminate near the midportion of the circuit strip and are spaced apart thereat to provide clearance for the signal ciruit conductor runs 65 and 68 to extend therebetween, as shown in FIG. 2. To enable activation of lamp group 57 by an impact pulse applied across terminals 20 and 22, some means must be provided for interconnecting common run 24 with the spaced apart common run 25 (connected to a terminal of each of the lamps 11-13) without interfering with the signal conductor runs 65 and 68. The same interconnecting means is necessary to enable activation of lamp group 58 from terminals 20' and 22', one terminal of each of the lamps 14-15 being connected to run 24.

In accordance with the present invention, this common circuit crossover between the spaced apart conductor runs 24 and 25 is accomplished by providing deposits of conductive material on the printed circuit strip which extend from respective ones of the common circuit runs onto the nearest edge 18c or 18d of the circuit strip facing a sidewall 36 or 38 of the channel 30. In this manner, when circuit strip 18 is assembled to the rear housing, the conductive deposits are in electrical contact with the continuous coating of conductive reflective material 42 on the channel walls, and the eletrical crossover between common runs 24 and 25 is provided via the reflector surfaces (material 42), which functions as an interconnecting jumper therebetween.

More specifically, referring to FIGS. 2-5, a conductive paste 84 (FIG. 4) is deposited on circuit strip 18, such as by dabbing it on, at locations A and B substantially adjacent to connector-terminals 20 and 20', respectively, and/or locations C and D substantially adjacent to respective terminations of the common circuit runs 24 and 25 about the midportion of the circuit strip. The deposit at location B is illustrated in various views by FIGS. 3-5. The conductive paste 84 may comprise a commercially available material based on silver or carbon particles in a suitable binder. As illustrated, a small quantity of this paste is coated about an edge corner of the circuit strip 18 such that, when dried a conductive path is provided (B in FIGS. 3-5) which is in contact with and extends from a common run (25 in FIGS. 3-5) onto an adjacent edge (18d in FIG. 4) of the circuit strip. Since circuit strip 18 is about equal to the width of channel 30, assembly of the circuit strip 18 is about equal to the width of channel 30, assembly of the circuit strip 18 and housing member 26 by locating the strip in channel 30, as illustrated, causes the conductive edge coatings at A and B and/or C and D to be pressed into electrical contact with the conductive reflective wall coating 42. Since coating 42 is continuous throughout the housing channel, and covers rear wall 40 and sidewalls 36 and 38, a lamp-firing pulse applied across terminal 20 and 22 is carried, in part, by the metalized reflector. That is, if deposits of conductive paste 84 are provided at points A and B, then an active circuit path, or interconnecting jumper, is provided from contact point A, through the reflector, to contact point B, so that runs 24 and 25 are interconnected and the first lamp 11 on the opposite end of the unit receives the pulse across its lead-in wire connector pads 11a' and 11b'. Alternatively, this interconnection may be provided by locating conductive deposits at points C and D rather than A and B. Further yet, to enhance reliability by redundancy, conductive deposits may be provided at points A, B, C and D. In this manner, a "ground" circuit is provided by runs 24 and 25, and the reflector interconnection, which makes contact with one lead wire of each of the lamps 11-16.

Returning now to the description of the printed circuit configuration, the first lamp to be fired, namely, lamp 11, is connected directly across the input terminals 20 and 22. The N/O connect switches 61 and 62 are series connected in that order with lamp 13, which is the third and last lamp to be fired, across the input terminals 20 and 22. And, the second lamp to be fired (lamp 12) is series connected with the N/O switch 61.

The radiant-energy-activated N/O connect switches 61 and 62 are in contact with and bridge across the circuit runs that are connected to them. The material for the connect switch is selected to be of the type initially having an open circuit or high resistance, the resistance thereof becoming literally zero or a lower value when the material receives radiation in the form of heat and/or light from a respective adjacent lamp, upon the lamp being flashed. For this purpose, each of the connect switches is respectively positioned behind and near to an associated flashlamp. More specifically, switch 61 is positioned behind lamp 11, and swich 62 is positioned behind lamp 12.

The high resistance paste used to make switches 61 and 62 may comprise a known mixture of silver compound and a binder. According to a preferred embodiment, however, the material comprises a silver compound such as silver carbonate, a binder such as polystyrene resin, a large proportion of electrically non-conductive inert particulate solids, such as titanium dioxide, and a protective oxidizing agent such as barium chromate. For example, as described in copending application Ser. No. 021,398, filed Mar. 19, 1979, and assigned to the present assignee, the dried composition of a specific silk screenable high resistance material comprises 67.43% silver carbonate, 22.48% titanium dioxide, 8.99% glass beads, 0.11% barium chromate, 0.07% lecithin as a wetting agent, and 0.91% polystyrene resin as a binder. The barium chromate was included to enhance environmental stability, as described in U.S. Pat. No. 4,087,233. This mixture is made into a paste by ball milling in a suitable solvent such as butyl cellosolve acetate. The solids content may be adjusted to suite the method of switch application. For silk screening over a circuit strip, it is preferred to adjust the solids content to about 74%.

The circuit on the circuit strip 18 functions as follows. Assuming that none of the three lamps on the upper half of the unit have been flashed, upon occurrence of the first firing pulse applied across the terminals 20 and 22, this pulse will be directly applied (via run 65 and the combination of runs 24, 25 and the reflector) to the lead-in wires of the first-connected flashlamp 11, whereupon lamp 11 flashes and becomes an open circuit between its lead-in wires. Heat and/or light radiation from the flashing first lamp 11 is operative to activat the N/O connect switch 61. As a result, the radiation causes the normally open connect switch 61 to become a closed circuit (or a low value or resistance), thereby connecting the circuit strip terminal 22 electrically to the second lamp 12 via circuit run 66. By the time this occurs, the firing pulse has diminished to a value insufficient to cause the second lamp 12 to flash.

When the next firing pulse occurs, it is applied to the lead-in wires of the second lamp 12 via the now closed connect switch 61, whereupon the second lamp 12 flashes and becomes an open circuit between its lead-in wires, with the lamp radiation causing the connect switch 62 to assume a near zero or low resistance. When the next firing pulse occurs, it is applied via the now closed connect switches 61 and 62 to the lead-in wires of the third flashlamp 13, whereupon causing the lamp to flash. Since this lamp is the least lamp in the active circuit, it does not matter whether its lead-in wires are an open or closed circuit after flashing. When the flash unit is turned around and the other connector tab 18b attached to the camera socket, the group 58 of lamps that theb becomes upper most and farthest away from the camera lens will be in the active circuit and will be flashed in the same manner as has been described. In a preferred embodiment, the lamps 11, etc., are high voltage types requiring about 2,000 volts, for example, at low current for flashing, and they can be fired by impacting or stressing a piezoelectric element in the camera.

The high degree of electrical sensitivity needed in high voltage flashlamps gives rise to distinct problems of inadvertent flashing during handling of the array package. Any static charges on equipment and personnel can cause the lamp to flash. Accordingly, as described in the aforementioned copening application Ser No. 072,251, electrostatic protection is provided by the rear housing member 26 in a cost-efficient manner by electrically connecting the conductive coating 42 to the common circuit conductor. By virtue of the present invention, this connection is automatically provided by the contact points at A and B and/or C and D between the coated channel sidewalls and common circuit runs 24 and 25. In this manner, continuous conductive surfaces on rear wall 40 and sidewalls 36 and 38 of channel 30, and on the reflector cavities and front faces of outer flanges 32 and 34, provide a protective electrostatic shield about three sides of the sensitive circuit strip 18 and the lamps 11-16 mounted thereon. Hence, the conductive reflector surfaces provided by coating 42 on housing 26 provide the multiple functions of (a) a multicavity reflector, (b) an interconnecting jumper between the common circuit runs 24 and 25 and (c) an effective electrostatic shield.

Protection against electrostatic charges about the front face of the unit is provided in a manner following the teachings of U.S. Pat. No. 4,113,424. Cover panel 28 is provided with eight openings 86 distributed throughout the length thereof, as illustrated, and housing member 26 further includes eight metal-coated posts, or projections, 88 which respectively fit into the front face openings 86. Preferably, the conductive reflector projections protrude through the openings 86 in the cover panel beyond the exterior surface thereof, as shown in FIG. 3, so as to assure electrical contact with any charged object such as a user's hand, which may touch the array housing.

As illustrated in FIGS. 1 and 2, projections 88 are symmetrically disposed on the front face of the housing flanges 32 and 34 between reflector cavity segments 11', 11" and 12', 12"; 12', 12" and 13', 13"; 14', 14" and 15', 15"; and 15', 15" and 16', 16". These projections 88 are integral molded portions of the insulating plastic material of housing 26 which are covered with the continuous conductive reflective coating 42. Accordingly, the conductive projections 88 are connected to the common circuit conductors 24 and 25 via the surface coating 42 and contact points A and B and/or C and D.

Although the invention has been described with respect to a specific embodiment, it will be appreciated that modifications and changes may be made by those skilled in the art without departing from the true spirit and scope of the invention. For example, the construction is not limited to linear high voltage arrays but is also adaptable to elongated planar arrays and the like, containing lamps ignitable by high voltage or low voltage sources (provided there is good electrical contact at points A–D). The array may be single ended, with a connector on only one end; the lamps may all be oriented in one direction; and the number of lamps may vary. For example, a higher output lamp array of the double ended type may comprise two lamps of much larger volume positioned in each of the upper and lower groups housed in a package of slightly larger dimensions.

We claim:

1. In a multilamp photoflash unit comprising, in combination, a printed circuit board in the form of an elongated strip and having lamp-firing circuitry on a surface thereof, an array of electrically ignitable flashlamps divided into first and second groups of two or more lamps each disposed on respectively opposite halves of said printed circuit strip over said surface thereof, each of said flashlamps having a pair of lead-in wires connected to said circuitry, said circuitry including first and second common circuit conductor runs which are spaced apart from each other on said surface of the printed circuit strip, said first common circuit run being connected electrically to one lead-in wire of each of said first group of lamps and said second common circuit run being connected electrically to one lead-in wire of each of said second group of lamps, and an elongated housing member having a longitudinal channel within which said printed circuit strip is located and having reflective surfaces adjacent said flashlamps, means for electrically interconnecting said first and second common circuit conductor runs comprising: a continuous coating of electrically conductive reflective material covering the walls of said channel for providing said reflective surfaces, and first and second means electrically connecting said reflective surfaces to said first and second common circuit conductor runs, respectively, whereby said conductive refletive material functions as an interconnecting jumper therebetween.

2. The photoflash unit of claim 1 wherein said first and second groups of lamps are disposed in a linear array, said channel in the housing member has a cross-section which is substantially semi-rectangular, said continuous coating of conductive reflective material covers the rear wall and opposite sidewalls of said semi-rectangular channel, said first and second connecting means respectively comprise first and second deposits of conductive material on said printed circuit strip extending from respective ones of said common circuit runs onto the nearest edge of said strip facing a sidewall of said channel, and the width of said printed circuit strip is about equal to the width of said channel, whereby said first and second deposits of conductive material are in electrical contact with the conductivity coated sidewalls of said channel.

3. The photoflash unit of claim 2 wherein said first and second common circuit runs are respectively disposed parallel and closer to opposite edges of said printed circuit strip facing opposite sidewalls of said channel, and said first and second deposits of conductive material are respectively in electrical contact with opposite sidewalls of said channel.

4. The photoflash unit of claim 1 wherein said printed circuit strip includes first and second connector-terminal means at respectively opposite ends thereof, said first connector-terminal means being located on the half of said circuit strip containing said first group of lamps and separated thereby from said second group of lamps, said second connector-terminal means being located on the half of said circuit strip containing said second group of lamps and separated thereby from said first group of lamps, said first common circuit run extends to said first connector-terminal means, said second common circuit run extends to said second connector-terminal means, a portion of said circuitry couples said first connector-terminal means to each lamp of said second group of lamps, another portion of said circuitry couples said second connector-terminal means to each lamp of said first group of lamps, and both of said coupling portions of circuitry include said first and second connecting means and said reflective surfaces, each of said coupling portions enabling flashing of a lamp in the group coupled thereto in response to flash activation signals applied to its associated connector-terminal means, thereby reducing the red-eye photographic effect.

5. The photoflash unit of claim 4 wheren said first and second groups of lamps are disposed in a linear array, said channel in the housing member has a cross-section which is substantially semi-rectangular, said continuous coating of conductive reflective material covers the rear wall and opposite sidewalls of said semi-rectangular channel, said first and second common circuit runs are respectively disposed parallel and closer to opposite edges of said printed circuit strip facing opposite sidewalls of said channel, said first and second connecting means respectively comprise first and second deposits of conductive material on said printed circuit strip extending from respective ones of said common circuit runs onto the nearest edge of said strip facing a sidewall of said channel, and the width of said printed circuit strip is about equal to the width of said channel, whereby said first and second deposits, of conductive material are respectively in electrical contact with the conductively coated opposite sidewalls of said channel.

6. The photoflash unit of claim 5 wherein first conductive deposit is located substantially adjacent to said first connector-terminal means, and said second conductive deposit is located substantially adjacent to said second connector-terminal means.

7. The photoflash unit of claim 6 wherein said first and second connecting means respectively further include third and fourth deposits of conductive material on said printed circuit strip extending from respective ones of said common circuit runs to the nearest edge of said strip facing a sidewall of said channel, said third conductive deposit is located substantially adjacent to a termination of said first common circuit run about the midportion of said circuit strip, said fourth conductive deposit is located substantially adjacent to a termination of said second common circuit run about the midportion of said circuit strip, and said third and fourth deposits of conductive material are respectively in electrical contact with opposite sidewalls of said channel.

8. The photoflash unit of claim 5 wherein said first conductive deposit is located substantially adjacent to a termination of said first common circuit run about the midportion of said circuit strip, and said second conductive deposit is located substantially adjacent to a termination of said second common circuit run about the midportion of said circuit strip.

9. The photoflash unit of claim 1 wherein said housing member is formed of an insulating material and further includes a plurality of segments of reflector cavities formed on opposite sides of said channel, and said continuous coating of electrically conductive reflective material covers the surfaces of said channel and said reflector cavities, said conductive reflector surfaces functioning as (a) reflectors for said flashlamps, (b) a interconnecting jumper between said first and second spaced apart common circuit runs, and (c) a shield to reduce the likelihood of said flashlamps being fired by electrostatic changes applied to said unit.

10. The photoflash unit of claim 18 further including a light-transmitting cover panel attached to said housing member and enclosing said flashlamps therein, said cover panel having a plurality of openings therein, and wherein said housing member further includes a plurality of projections covered with said continuous coating of conductive reflective material, said coated projections respectively fitting into the openings of said cover panel and protruding therethrough beyond the exterior surface of said panel.

* * * * *